United States Patent
Kurupati

(10) Patent No.: US 7,542,535 B2
(45) Date of Patent: Jun. 2, 2009

(54) METHOD AND APPARATUS FOR RECOVERING A CLOCK SIGNAL

(75) Inventor: Sreenath Kurupati, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 10/880,969

(22) Filed: Jun. 30, 2004

(65) Prior Publication Data

US 2006/0002500 A1 Jan. 5, 2006

(51) Int. Cl.
*H04L 7/02* (2006.01)
(52) U.S. Cl. .................. 375/355; 375/376; 375/373; 375/215; 375/374; 375/327
(58) Field of Classification Search ............ 375/354, 375/279, 355, 225, 365, 368, 332
See application file for complete search history.

(56) References Cited

U.S. PATENT DOCUMENTS 4,787,095 A * 11/1988 Forth et al. ............. 375/365
2004/0057542 A1 * 3/2004 Knapp et al. ............. 375/355
2004/0080671 A1 * 4/2004 Siemens et al. ........... 348/473
2006/0034388 A1 * 2/2006 Mizuguchi et al. ........ 375/295

* cited by examiner

*Primary Examiner*—Shuwang Liu
*Assistant Examiner*—Kabir A Timory
(74) *Attorney, Agent, or Firm*—Schwegman, Lundberg & Woessner, P.A.

(57) ABSTRACT

A method includes receiving a serial data signal including a preamble and an embedded clock signal having an embedded clock signal frequency, and processing the preamble using logic to determine the embedded clock signal frequency. An apparatus includes a counter unit, a state machine, and a logic unit. The counter unit includes a data port, a clock port and a plurality of counters. In operation, the data port receives a serial data signal and the clock port receives a clock signal having a clock signal frequency. The serial data signal includes a preamble and an embedded clock signal having an embedded clock signal frequency. The state machine identifies at least one of the plurality of counters to count between transitions in the preamble in response to the clock signal. The logic unit is coupled to the plurality of counters and determines the embedded clock signal frequency.

24 Claims, 11 Drawing Sheets

| PREAMBLE | PREVIOUS CELL="0" | PREVIOUS CELL="1" |
|---|---|---|
| "B" | 11101000 | 00010111 |
| "M" | 11100010 | 00011101 |
| "W" | 11100100 | 00011011 |

FIG. 3

$$\text{PREAMBLE COUNT} = \text{COUNT1} + \text{COUNT2} + \text{COUNT3} + \text{COUNT4}$$

$$\text{CLOCK RATIO} = \text{PREAMBLE COUNT} /8$$

$$\text{JITTER COMPENSATION} = \text{CLOCK RATIO} /4$$

$$\text{T1\_UPPER} = \text{CLOCK RATIO} + \text{JITTER COMPENSATION}$$

$$\text{T2\_UPPER} = 2* \text{CLOCK RATIO} + \text{JITTER COMPENSATION}$$

$$\text{T3\_UPPER} = 3* \text{CLOCK RATIO} + \text{JITTER COMPENSATION}$$

$$\text{T1\_LOWER} = \text{CLOCK RATIO} - \text{JITTER COMPENSATION}$$

$$\text{T2\_LOWER} = 2* \text{CLOCK RATIO} - \text{JITTER COMPENSATION}$$

$$\text{T3\_LOWER} = 3* \text{CLOCK RATIO} - \text{JITTER COMPENSATION}$$

802 {
IF
  (((T3_LOWER < COUNT1) && (COUNT1 < T3_UPPER)) &&
  ((T1_LOWER < COUNT2) && (COUNT2 < T1_UPPER)) &&
  ((T1_LOWER < COUNT3) && (COUNT3 < T1_UPPER)) &&
  ((T3_LOWER < COUNT4) && (COUNT4 < T3_UPPER)))
THEN PREAMBLE B DETECTED;

804 {
ELSE IF
  (((T3_LOWER < COUNT1) && (COUNT1 < T3_UPPER)) &&
  ((T3_LOWER < COUNT2) && (COUNT2 < T3_UPPER)) &&
  ((T1_LOWER < COUNT3) && (COUNT3 < T1_UPPER)) &&
  ((T1_LOWER < COUNT4) && (COUNT4 < T1_UPPER)))
THEN PREAMBLE M DETECTED;

806 {
ELSE IF
  (((T3_LOWER < COUNT1) && (COUNT1 < T3_UPPER)) &&
  ((T2_LOWER < COUNT2) && (COUNT2 < T2_UPPER)) &&
  ((T1_LOWER < COUNT3) && (COUNT3 < T1_UPPER)) &&
  ((T2_LOWER < COUNT4) && (COUNT4 < T2_UPPER)))
THEN PREAMBLE W DETECTED.

METHOD AND APPARATUS FOR RECOVERING A CLOCK SIGNAL

FIELD

The method and apparatus relate to logic systems that receive a serial data signal. More particularly, the method and apparatus relate to digitally recovering a clock signal from a serial data signal.

BACKGROUND

Analog clock signal recovery systems are used to recover clock signals in a digital logic system, such as a processor or microprocessor. Clock signal recovery or the identification of a clock signal frequency is sometimes a prerequisite to recovering data synchronized to the clock signal. Analog clock signal recovery systems, which are sometimes used in connection with processors or microprocessors fabricated on a single die, include non-digital components, such as phase-locked loops, linear amplifiers, and filters. These components can occupy a significant amount of space on a die. In some instances, analog clock signal recovery systems include components that are not easily fabricated on a die. Further, semiconductor processes, in addition to those used to fabricate digital components, may be necessary to fabricate these non-digital components. For these and other reasons, there is a need for a method and apparatus for digitally recovering a clock signal.

BRIEF DESCRIPTION OF THE DRAWINGS

FIG. 3 is a chart showing exemplary preamble data patterns suitable for use in connection with the serial data signal, shown in FIG. 2, in accordance with some embodiments of the invention.

FIG. 7 shows example calculations suitable for use in connection with processing information in the logic unit, shown in FIG. 1, in accordance with some embodiments of the invention.

FIG. 8 shows example logic expressions suitable for use in connection with identifying the preambles, provided in the chart shown in FIG. 3, during the processing of the serial data signal, shown in FIG. 2, by the logic unit, shown in FIG. 1, in accordance with some embodiments of the invention.

DESCRIPTION

Figure 1:
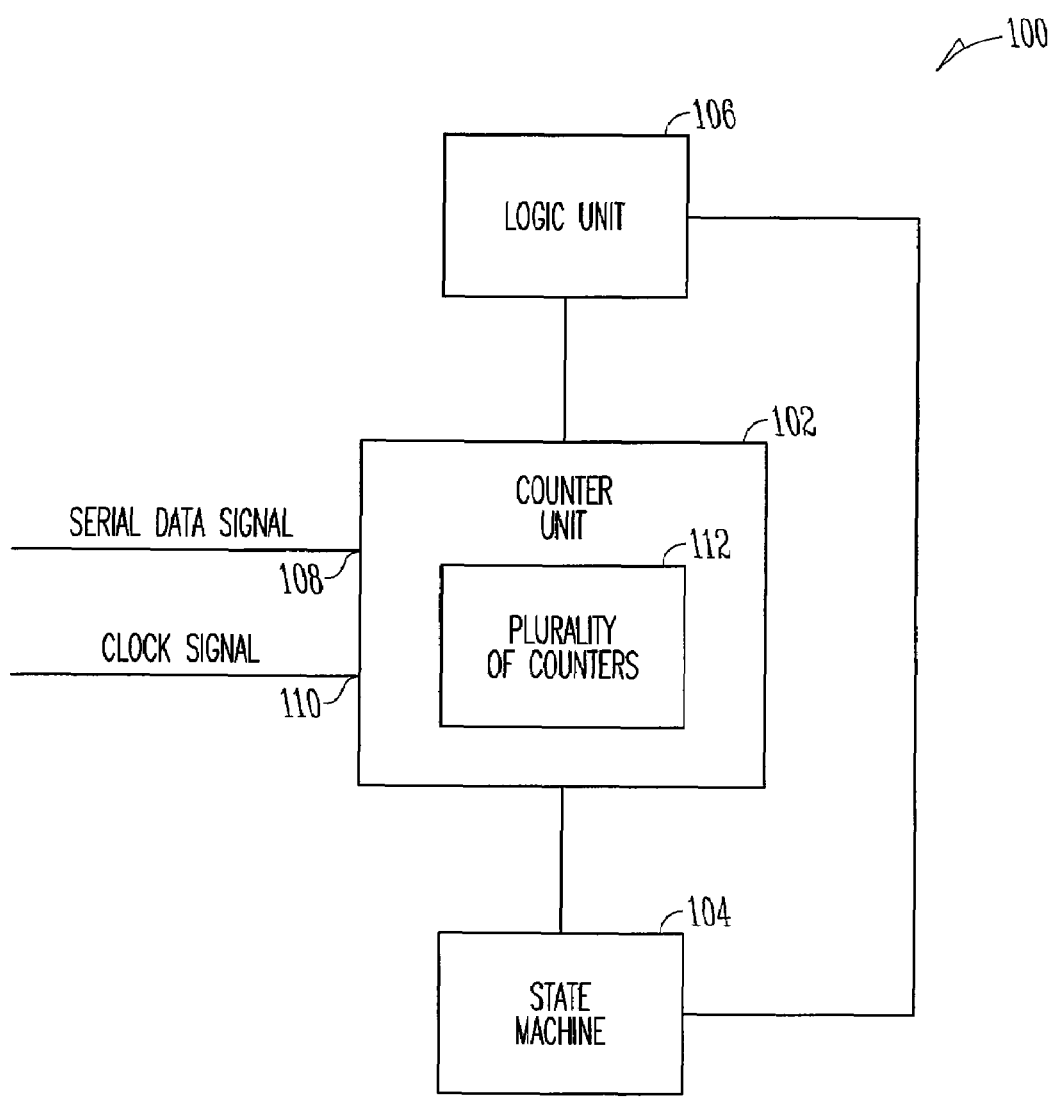
FIG. 1 is a block diagram of an apparatus including a counter unit, a state machine, and a logic unit in accordance with some embodiments of the invention.

In the following description of some embodiments of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice embodiments of the invention. Other embodiments may be utilized and structural, logical, and electrical changes may be made without departing from the scope of the invention. The following detailed description is not to be taken in a limiting sense, and the scope of the invention is defined only by the appended claims, along with the full scope of equivalents to which such claims are entitled.

Figure 2:
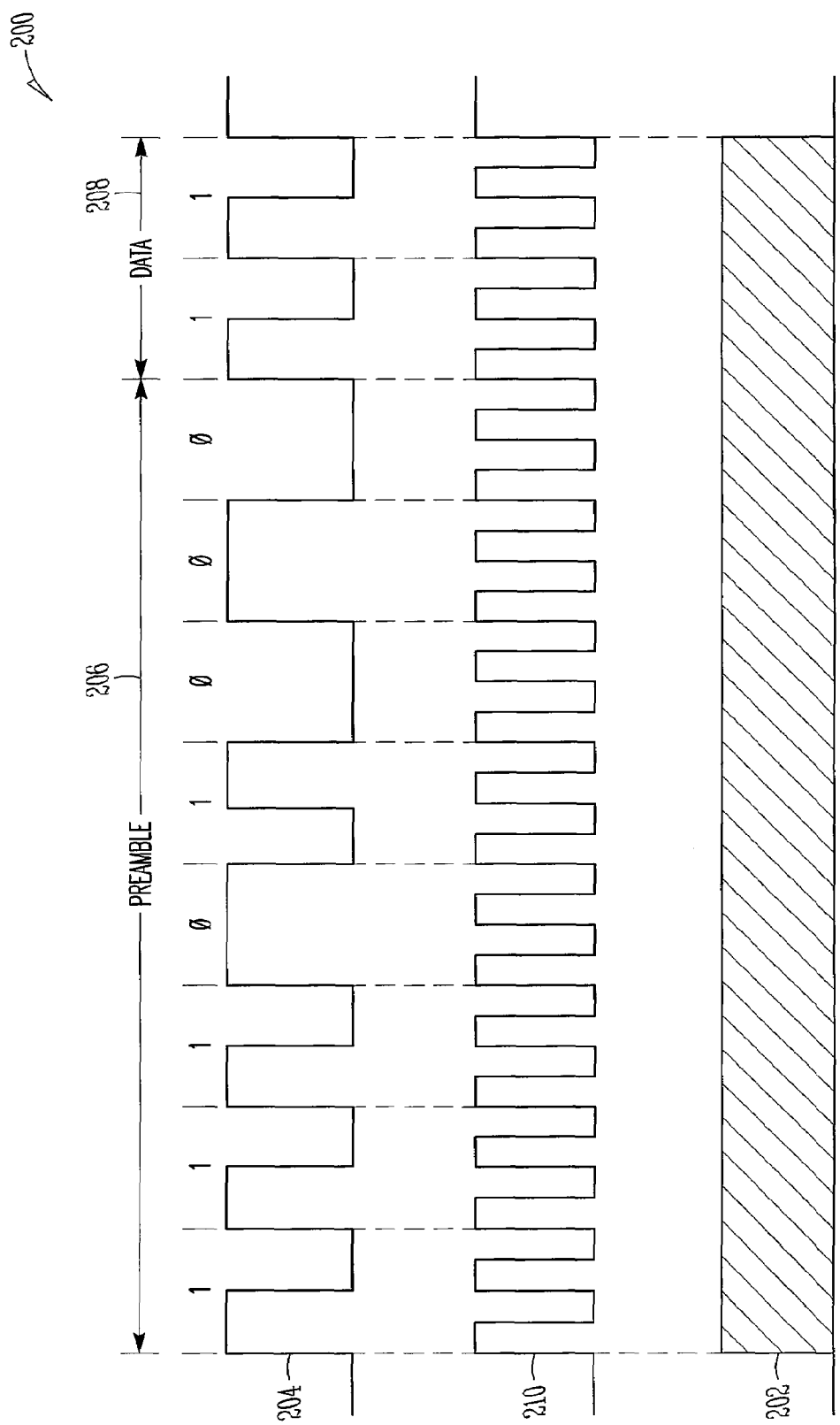
FIG. 2 is an illustration of a timing diagram showing a clock signal and a serial data signal including a preamble, data, and an embedded clock signal suitable for use in connection with the apparatus, shown in FIG. 1, in accordance with some embodiments of the invention.

FIG. 1 is a block diagram of an apparatus 100 including a counter unit 102, a state machine 104, and a logic unit 106 in accordance with some embodiments of the invention. The counter unit 102 is coupled to the state machine 104 and the logic unit 106. The state machine 104 is coupled to the logic unit 106. The counter unit 102 includes a data port 108, a clock port 110, and a plurality of counters 112. The data port 108 receives a serial data signal. An exemplary serial data signal, including an embedded clock signal, suitable for use in connection with the apparatus 100 is shown in FIG. 2 and described below. The clock port 110 receives a clock signal. An exemplary clock signal suitable for use in connection with the apparatus 100 is shown in FIG. 2 and described below.

FIG. 2 is an illustration of a timing diagram 200 showing a clock signal 202 and a serial data signal 204 including a preamble 206, data 208, and an embedded clock signal 210 suitable for use in connection with the apparatus 100, shown in FIG. 1, in accordance with some embodiments of the invention. The illustration of the clock signal 202 does not show all clock transitions. Exemplary clock signals suitable for use in connection with the apparatus 100 include clock signals that are several times faster than the embedded clock signal 210. In some embodiments, the frequency of the clock signal 210 approaches the frequency limit of the apparatus 100. In some embodiments, the clock signal 202 has a frequency that is about fifty times the frequency of the embedded clock signal 210. The serial data signal 204 is a biphase mark encoded signal. In a biphase mark encoded signal, a one is transmitted as a signal transition followed by a signal transition. A zero is transmitted as a signal transition followed by no signal transition. A preamble is an introductory sequence of information that identifies the information that follows the preamble. For example, if the serial data signal 204 includes two channels of audio information, the preamble contains channel identification information to identify the channel on which the information following the preamble is transmitted. As can be seen in FIG. 2, the preamble 206 data pattern is 1 1 1 0 1 0 0 0 and the data 208 data pattern is 1 1. Neither the preamble 206 nor the data 208 is limited to a particular number of bits. In some embodiments, such as for some audio signals, the preamble 206 includes eight bits and the data 208 includes thirty-two bits. Exemplary preamble 206 data patterns are shown in a chart provided in FIG. 3. The serial data signal 204 includes the embedded clock signal 210. The embedded clock signal 210 is shown separated from the serial data signal 204 for illustration purposes only.

Referring to FIG. 1 and FIG. 2, in operation, the apparatus 100 provides for recovery of the embedded clock signal 210 in the serial data signal 204 received at the data port 108 by determining the embedded clock signal frequency. The counter unit 102 receives the serial data signal 204 at the data port 108. The counter unit 102 also receives the clock signal 202 at the clock port 110. The frequency of the clock signal 202 is greater than the frequency of the embedded clock signal 210. The state machine 104 designates at least one of the plurality of counters 112 to count between transitions in the preamble 206 in response to the clock signal 202. In some embodiments, transitions are zero-to-one data transitions and one-to-zero data transitions. Hence, by sampling the information included in the preamble 206, the counter unit 102 acquires information related to the timing of the preamble 206 and the serial data signal 204. Jitter is the variation from the ideal in the timing of a signal. The logic unit 106 processes the information related to the preamble 206 to determine a jitter value. The logic unit 106 also processes the information related to the preamble 206 to determine the embedded clock signal frequency of the serial data signal 204. The jitter value is included in the determination of the embedded clock signal frequency. Those skilled in the art will appreciate that the apparatus 100 is suitable for use in connection with the serial data signal 204 formatted in a digital audio transfer format, such as the Sony/Philips Digital Interface (SPDIF) format.

FIG. 3 is a chart 300 showing exemplary preamble data patterns suitable for use in connection with the serial data signal 204, shown in FIG. 2, in accordance with some embodiments of the invention. The exemplary data patterns shown in FIG. 3 are used in the transmission of serial audio data. Row "B" includes a preamble data pattern that marks a word as including channel A data at the start of a data-block. Row "M" includes a preamble data pattern that marks a word as including channel A data that is not at the start of a data-block. Row "W" includes a preamble data pattern that marks a word as including channel B data. The first column of preamble data shows preamble data when the previous data cell included a zero. The second column of preamble data shows preamble data when the previous data cell included a one.

Figure 4:
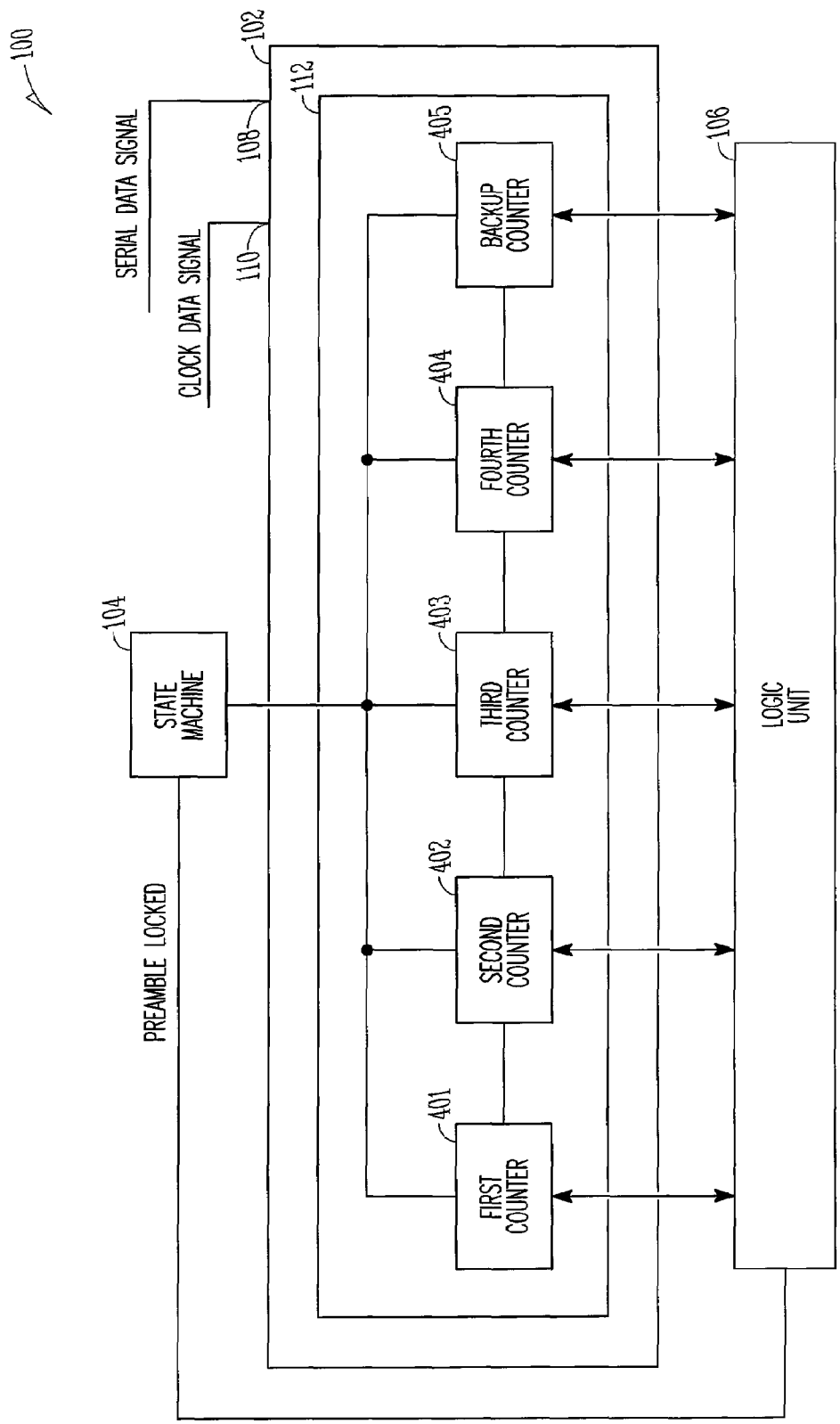
FIG. 4 is a detailed block diagram of the apparatus, shown in FIG. 1, including the plurality of counters in accordance with some embodiments of the invention.

FIG. 4 is a detailed block diagram of the apparatus 100, shown in FIG. 1, including the plurality of counters 112 in accordance with some embodiments of the invention. To determine the embedded clock frequency, the plurality of counters 112 measure the time between transitions in the preamble 206, shown in FIG. 2, of the serial data signal 204, shown in FIG. 2. The plurality of counters 112 includes a first counter 401, a second counter 402, a third counter 403, a fourth counter 404, and a backup counter 405. Each of the counters 401, 402, 403, 404, and 405 is coupled to the state machine 104 and to the logic unit 106. Each of the counters 401, 402, 403, 404, and 405 is coupled to at least another of the counters 401, 402, 403, 404, and 405. This coupling provides for shifting counts between counters. The state machine 104 is coupled to the logic unit 106. The state machine 104 receives a preamble locked signal from the logic unit 106. The logic unit 106 transmits the preamble locked signal to indicate that a preamble has been identified.

In operation, the first counter 401 accumulates a count that represents the length of the first sequence of data cells in the preamble 206, shown in FIG. 2. The second counter 402 accumulates a count that represents the length of the second sequence of data cells in the preamble 206. The third counter 403 accumulates a count that represents the length of the third sequence of data cells in the preamble 206. The fourth counter 404 accumulates a count that represents the length of the fourth sequence of data cells in the preamble 206. The function of backup counter 405 is included in the description of the state diagram representation, shown in FIG. 5, of the state machine 104, shown in FIG. 1. The preamble 206 includes one of a plurality of preamble formats, such as the preamble formats shown in FIG. 3. The counts accumulated in the first counter 401, the second counter 402, the third counter 403, and the fourth counter 404 are processed to identify the preamble format included in the serial data signal 204, shown in FIG. 2. The serial data signal 204 is sampled at the frequency of the clock signal 202, shown in FIG. 2. The first counter 401 is incremented at the frequency of the clock signal 202 until the serial data signal 204 transitions. For example, consider a 100 megahertz clock signal and a two megahertz embedded clock signal. The frequency of the embedded clock signal is not initially known by the receiver. During transmission of the preamble B, shown in FIG. 3, the count accumulated in the first counter 401 represents the length of the data cell including three ones, which will be equal to 3*100/2=150. To account for jitter in the serial data signal 204, the first counter 401 accumulates a value equal to about 150+/− the jitter correction. In some embodiments, a transition is detected by storing the last data value of serial data signal 204 and comparing the last data value to the present data value of the serial data signal 204. If the present data value is different from the last data value, then a transition has occurred.

Figure 5:
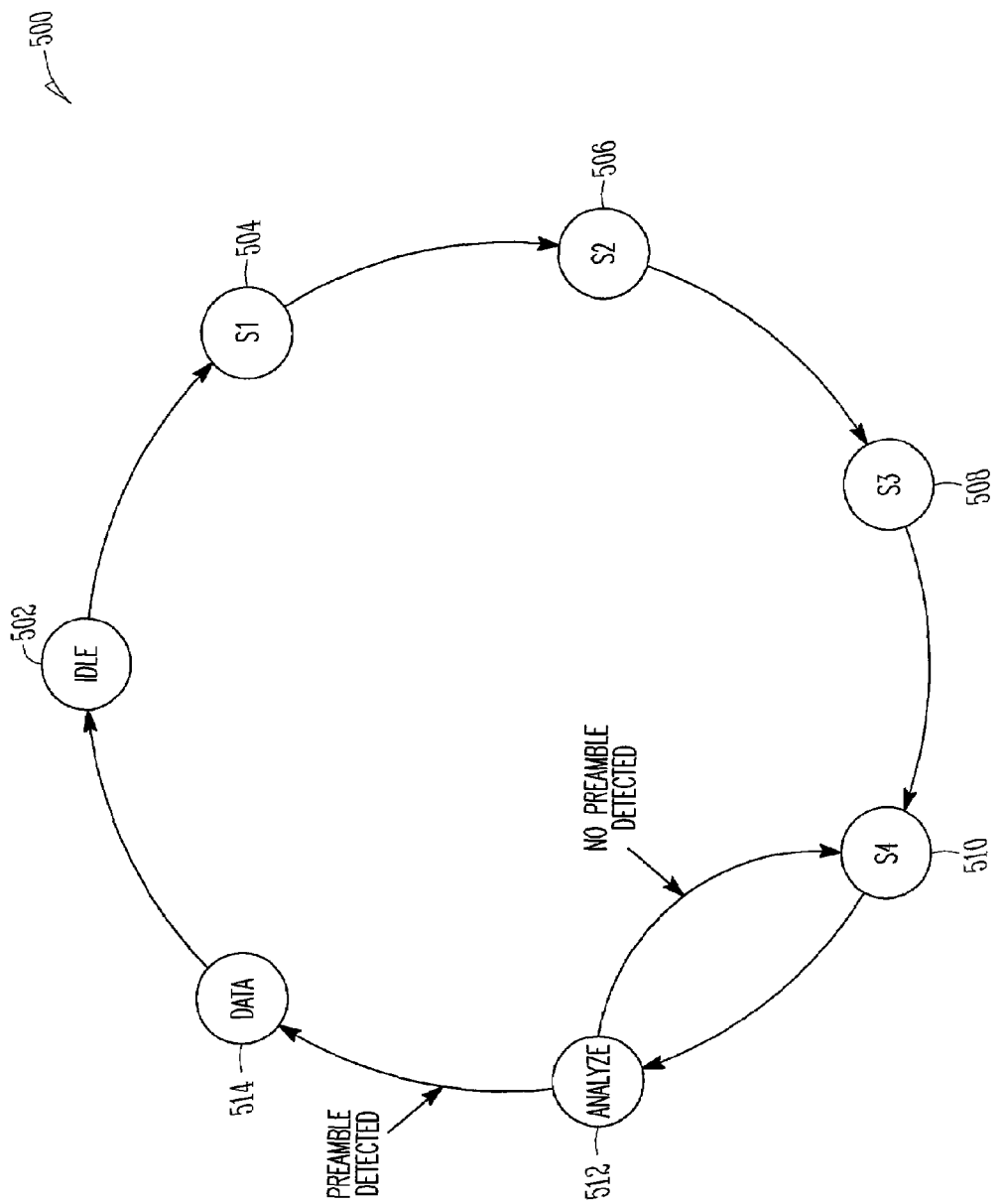
FIG. 5 is an illustration of a state diagram representation of the state machine, shown in FIG. 1, in accordance with some embodiments of the invention.

FIG. 5 is an illustration of a state diagram 500 representation of the state machine 104, shown in FIG. 1, in accordance with some embodiments of the invention. A state machine stores a-state at a given time and can operate on an input signal to change state. The state diagram 500 includes the states IDLE 502, S1 504, S2 506, S3 508, S4 510, ANALYZE 512 and DATA 514. Those skilled in the art will appreciate that the state machine 104 is not limited to a particular number of states and the states shown in the state diagram 500 are only one exemplary set of states suitable for use in connection with the implementation of the state machine 104.

Referring to FIG. 1, FIG. 2, FIG. 4, and FIG. 5, in the operation of the apparatus 100, the first counter 401, the second counter 402, the third counter 403, the fourth counter 404, and the backup counter 405 are initialized to zero. When the first data transition in the serial data signal 204 is received, the state machine 104 enters the S1 504 state. The first counter 401 is incremented once every clock cycle until the next data transition, which causes the state machine 104 to enter the S2 506 state. While the state machine 104 is in the S2 506 state, the second counter 402 is incremented. The next data transition causes the state machine 104 to enter the S3 508 state. While the state machine 104 is in the S3 508 state, the third counter 403 is incremented. The next data transition causes the state machine 104 to enter the S4 510 state. While the state machine 104 is in the S4 510 state, the fourth counter 404 is incremented. The next data transition causes the state machine 104 to enter the ANALYZE 512 state. In the ANA- LYZE 512 state, the logic unit 106 determines, by processing the count values stored in the first counter 401, the second counter 402, the third counter 403, and the fourth counter 404, whether a preamble has been received. If a preamble is detected, then the logic unit 106 also determines the embedded clock frequency. The embedded clock frequency is stored as the ratio of the clock frequency counts to the embedded clock frequency counts. If a preamble is detected, then the state machine 104 enters the data 514 state. In the data 514 state, data, such as thirty-two bits of audio data is received. After the data is received, the state machine 104 enters the IDLE 502 state and waits for the next preamble. In the ANALYZE 512 state, if the count values are not indicative of a preamble, then the state machine 104 enters the S4 510 state. In the S4 510 state, the count values stored in the first counter 401, the second counter 402, the third counter 403, the fourth counter 404, and the backup counter 405 are shifted by one counter. The information stored in the second counter 402 is shifted to the first counter 401. The information stored in the third counter 403 is shifted to the second counter 402. The information stored in the fourth counter 404 is shifted to the third counter 403. The information stored in the backup counter 405 is shifted into the fourth counter 404. After shifting the count values, the state machine 104 increments the fourth counter 404 while waiting for a data transition in the serial data signal 204.

Figure 6A:
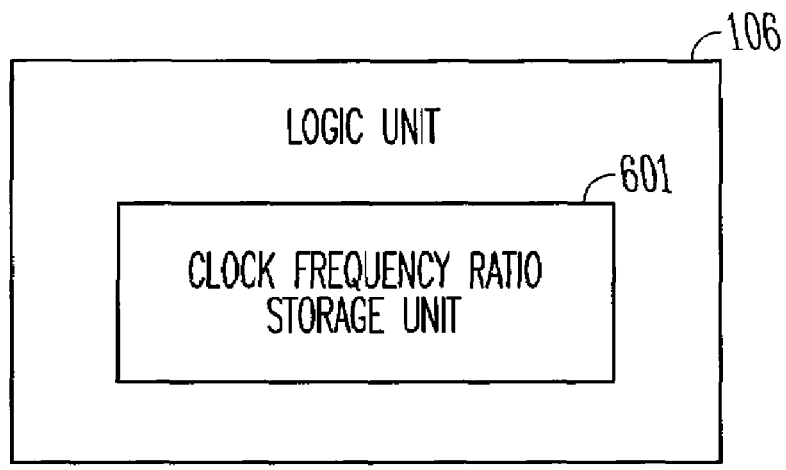
FIG. 6A is a block diagram of the logic unit, shown in FIG. 1, including a clock frequency ratio storage unit in accordance with some embodiments of the invention.

FIG. 6A is a block diagram of the logic unit 106, shown in FIG. 1, including a clock frequency ratio storage unit 601 in accordance with some embodiments of the invention. The logic unit 106 includes the clock frequency ratio storage unit 601 to store a ratio of the clock signal frequency to the embedded clock signal frequency. For example, if the embedded clock signal frequency of the serial data signal 204, shown in FIG. 2, is two megahertz and the clock signal frequency of the clock signal 202, shown in FIG. 2, is one-hundred megahertz, then the value stored in the clock frequency ratio storage unit 601 is fifty (the ratio of the clock signal frequency count to the embedded clock signal frequency count). The preamble count is the sum of the values stored in the counters 401, 402, 403, and 404, shown in FIG. 4, after a preamble is detected. The ratio of the clock signal frequency to the embedded clock signal frequency is derived from the preamble count. In some embodiments, the preamble count is divided by the number of data cells or data bits included in the preamble. For example, if the preamble includes eight data cells, then the preamble count is divided by eight to obtain the ratio of the clock signal frequency to the embedded clock signal frequency. Thus, after the preamble count is stored in the clock frequency ratio storage unit 601, a right shift by three produces the ratio of the clock signal frequency to the embedded clock signal frequency.

Figure 6B:
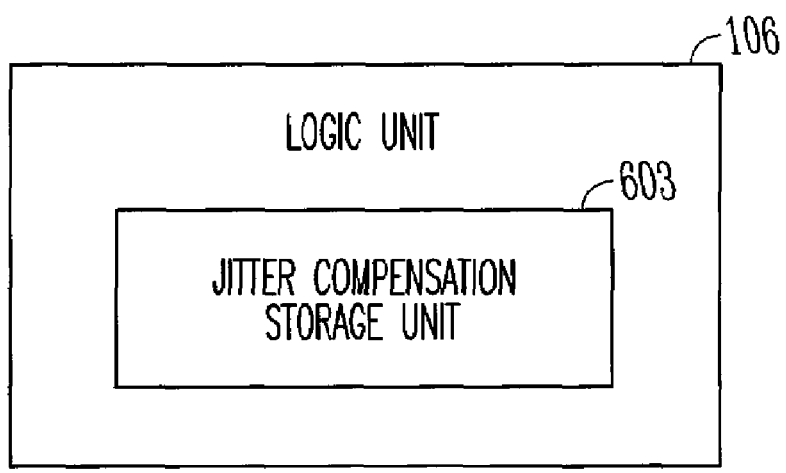
FIG. 6B is a block diagram of the logic unit, shown in FIG. 1, including a jitter compensation storage unit in accordance with some embodiments of the invention.

FIG. 6B is a block diagram of the logic unit 106, shown in FIG. 1, including a jitter compensation storage unit 603 in accordance with some embodiments of the invention. Jitter is the variation from the ideal in the timing of a signal. The logic unit 106 includes the jitter compensation storage unit 603 to store a jitter value associated with the serial data signal 204, shown in FIG. 2. In the apparatus 100, shown in FIG. 1, the serial data signal 204, received at the data port 108, includes jitter. If a communications specification allows for twelve percent jitter, then twelve percent jitter compensation is included in determining the embedded clock signal frequency. For example, for a 100 megahertz clock signal and an embedded clock signal frequency of two megahertz, the ratio of the clock signal to the embedded clock signal frequency is fifty. Twelve percent of fifty is six and because jitter can occur on both the rising and falling edges of the serial data signal 204 the jitter compensation is equal to twelve. Twelve is stored in the jitter compensation unit 603. In some embodiments, the jitter compensation value is calculated from the preamble count. For example, for a jitter of twenty-five percent and a preamble that includes eight data cells, the preamble count is divided by thirty-two to obtain the jitter compensation value. Thus, after the preamble count is stored in the clock frequency ratio storage unit 603, a right shift of five produces the jitter compensation value.

Figure 6C:
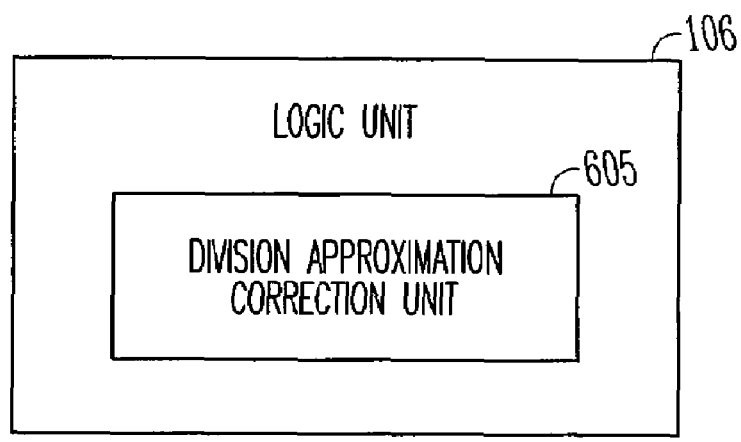
FIG. 6C is a block diagram of the logic unit, shown in FIG. 1, including a division approximation correction unit in accordance with some embodiments of the invention.

FIG. 6C is a block diagram of the logic unit 106, shown in FIG. 1, including a division approximation correction unit 605 in accordance with some embodiments of the invention. The division approximation correction unit 605 provides a correction term that is added to the clock frequency ratio stored in the clock frequency ratio storage unit 601 and to the jitter value stored in the jitter compensation storage unit 603. For the clock frequency ratio, the correction term corrects for the error introduced by right shifting the preamble count to calculate the clock frequency ratio stored in the clock frequency ratio storage unit 601. For the jitter value, the correction term corrects for right shifting the preamble count to calculate the jitter value stored in the jitter compensation storage unit 603. In some embodiments, the division approximation correction unit 605 provides a correction term having a value of one.

Figure 6D:
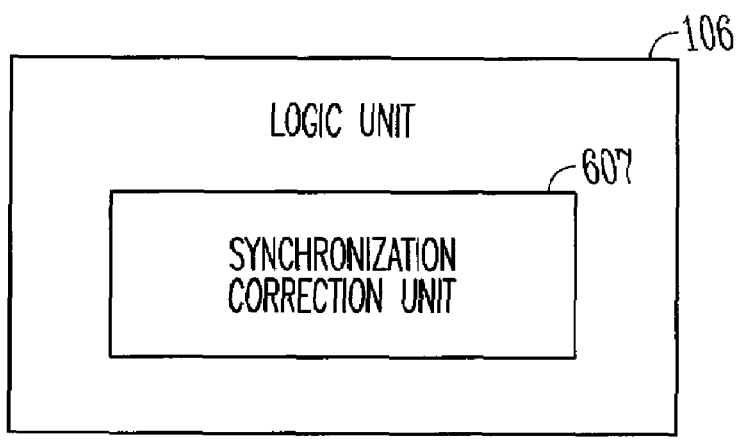
FIG. 6D is a block diagram of the logic unit, shown in FIG. 1, including a synchronization correction unit in accordance with some embodiments of the invention.

FIG. 6D is a block diagram of the logic unit 106, shown in FIG. 1, including a synchronization correction unit 607 in accordance with some embodiments of the invention. The synchronization correction unit 607 provides a correction term that is added to the jitter value stored in the jitter compensation storage unit 603. The synchronization correction term corrects for the error introduced when two back-to-back flip-flops (not shown) are used to synchronize the serial data signal 204, shown in FIG. 2. In some embodiments, the synchronization correction unit 607 provides a correction term having a value of one.

FIG. 7 shows example calculations 700 suitable for use in connection with processing information in the logic unit, shown in FIG. 1, in accordance with some embodiments of the invention. The preamble count is formed by summing the values stored in at least some of the plurality of counters 112, shown in FIG. 1, included in the counter unit 102, shown in FIG. 1. In some embodiments, the ratio of the clock signal frequency to the embedded clock signal frequency (clock ratio) is formed by dividing the preamble count by eight. In some embodiments, the jitter compensation value is formed by dividing the preamble count by thirty-two. The terms T1_upper, T2_upper, T3_upper, T1_lower, T2_lower, and T3_lower are formed as shown in FIG. 7. These terms are used, as illustrated in FIG. 8, to identify preamble formats, shown in FIG. 3, included in the serial data signal 204, shown in FIG. 2.

FIG. 8 shows example logic expressions 800 suitable for use in connection with identifying the preambles, provided in the chart shown in FIG. 3, during the processing of the serial data signal 204, shown in FIG. 2, by the logic unit 106, shown in FIG. 1, in accordance with some embodiments of the invention. Preamble "B" is detected when a "true" value results from the evaluation of logical expression 802. Preamble "M" is detected when a "true" value results from the evaluation of logical expression 804. Preamble "W" is detected when a "true" value results from the evaluation of logical expression 806.

Figure 9:
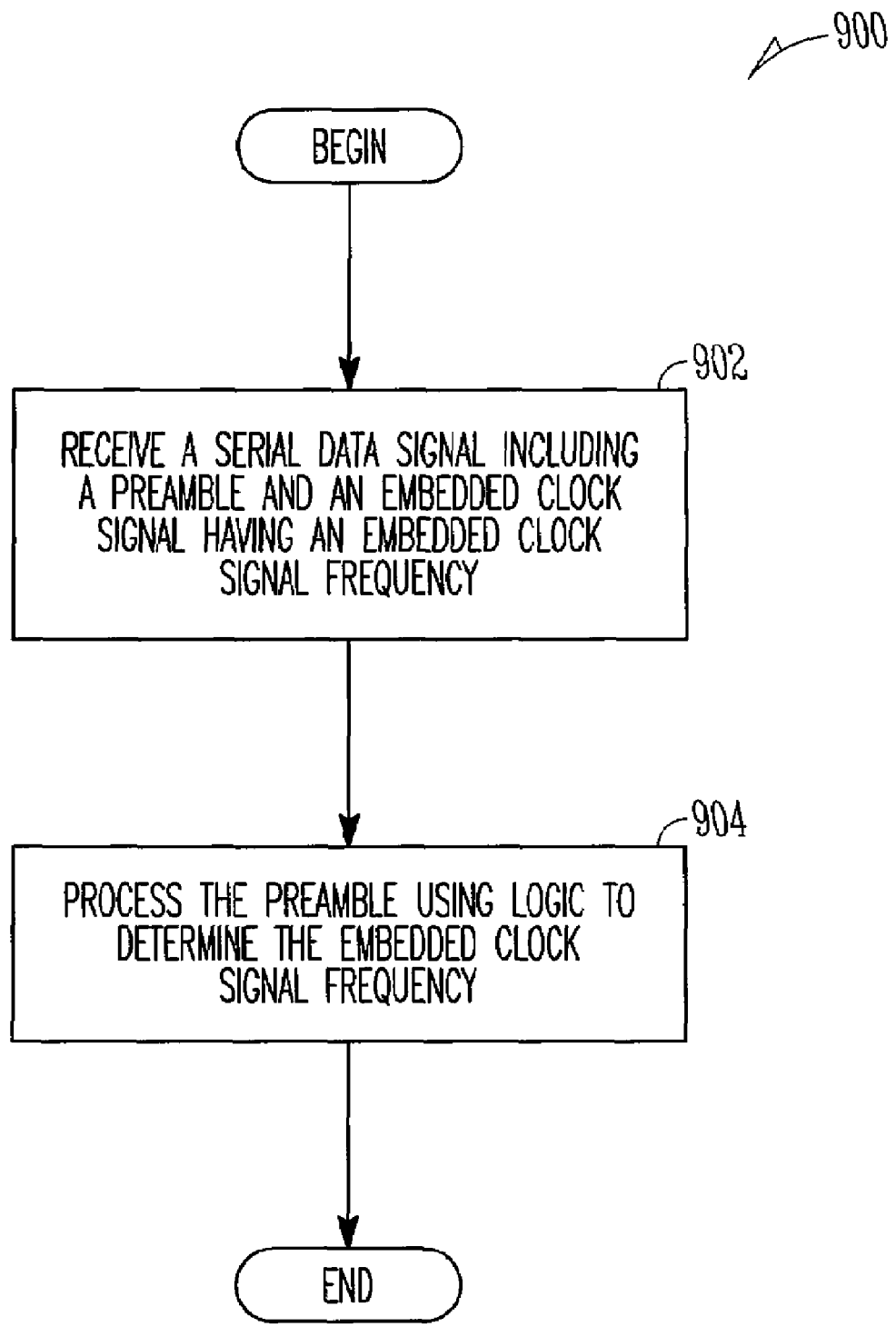
FIG. 9 is a flow diagram of a method including receiving a serial data signal including a preamble and an embedded clock signal having an embedded clock signal frequency and processing the preamble using logic to determine the embedded clock signal frequency in accordance with some embodiments of the invention.

FIG. 9 is a flow diagram of a method 900 including receiving a serial data signal including a preamble and an embedded clock signal having an embedded clock signal frequency (block 902) and processing the preamble using logic to determine the embedded clock signal frequency in accordance with some embodiments of the invention (904).

In some embodiments, processing the preamble using logic to determine the embedded clock signal frequency includes receiving a clock signal having a clock signal frequency and processing the preamble at a frequency related to the clock signal frequency to generate one or more measurements of one or more data patterns included in the preamble. In some embodiments, processing the preamble at the frequency related to the clock signal frequency to generate the one or more measurements of the one or more data patterns included in the preamble includes sampling the preamble and recording information from sampling the preamble in one or more counters. In some embodiments, the method that includes sampling the preamble and recording information from sampling the preamble in one or more counters further includes processing information in the one or more counters to determine the embedded clock frequency.

In some embodiments, the method 900, which includes processing the preamble using logic to determine the embedded clock signal frequency, includes one or more error terms in the processing to determine the embedded frequency. In some embodiments, including one or more error terms in the processing to determine the embedded clock signal frequency includes including a jitter value in the processing to determine the embedded clock signal frequency. In some embodiments, including the one or more error terms in the processing to determine the embedded frequency includes including a synchronization error value in the processing to determine the embedded clock signal frequency. In some embodiments, including the one or more error terms in the processing to determine the embedded frequency includes including a division approximation error value in the processing to determine the embedded clock signal frequency.

In some embodiments, in the method 900 the preamble includes eight bits. In some embodiments, in the method 900 the preamble has a length and processing the preamble using logic to determine the embedded clock signal frequency includes measuring the length.

Figure 10:
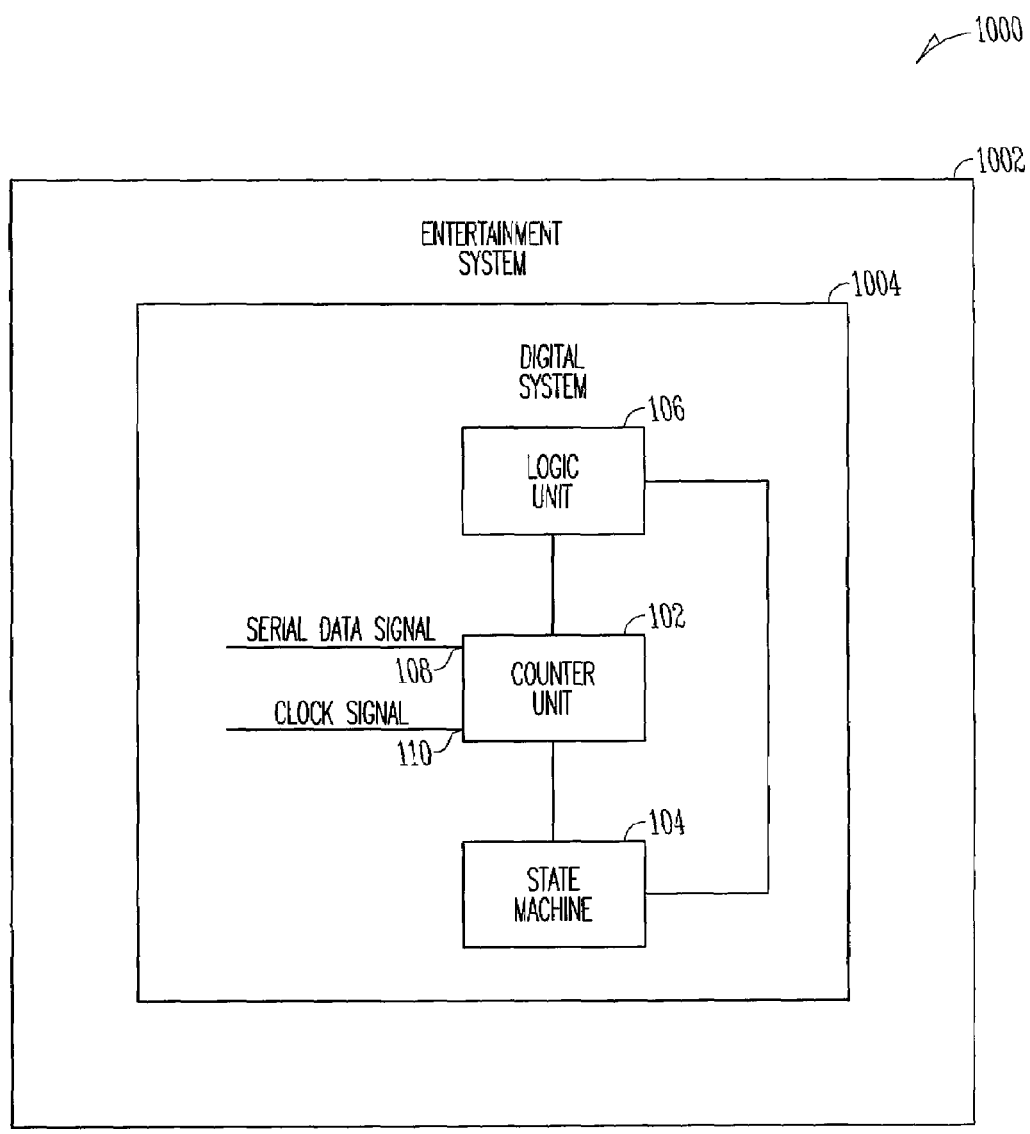
FIG. 10 is a block diagram of an apparatus including an entertainment system and a digital system including, as shown in FIG. 1, the counter unit, the state machine, and the logic unit in accordance with some embodiments of the invention.

FIG. 10 is a block diagram of an apparatus 1000 including an entertainment system 1002 and a digital system 1004 including, as shown in FIG. 1, the counter unit 102, the state machine 104, and the logic unit 106 in accordance with some embodiments of the invention. The counter unit 102, the state machine 104, and the logic unit 106 are included in the entertainment system 1002. The digital system 1004 includes the data port 108 to receive the serial data signal 204, shown in FIG. 2, and the clock port 110 to receive the clock signal 202, shown in FIG. 2. The serial data signal 204 includes the preamble 206, shown in FIG. 2, and the embedded clock signal 210, shown in FIG. 2. The clock signal 202 has a clock signal frequency. The embedded clock signal 210 has an embedded clock signal frequency. The digital system 1004 samples the preamble 206 at a frequency related to the clock signal frequency and forms a ratio of the clock signal frequency to the embedded clock signal frequency.

The entertainment system 1002 includes information display devices. Exemplary information display devices suitable for use in connection with the entertainment system 1002 include televisions, music systems, video projection systems, and film projection systems.

The digital system 1004 is not limited to a particular set of digital system components. In some embodiments, the digital system 1004 includes the clock frequency ratio storage unit 601, shown in FIG. 6A, the jitter compensation storage unit 603, shown in FIG. 6B, the division approximation correction unit 605, shown in FIG. 6C, or the synchronization correction unit 607, shown in FIG. 6D.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

If the specification states a component, feature, structure, or characteristic "may," "might," or "could" be included, that particular component, feature, structure, or characteristic is not required to be included. If the specification or claims refers to "a" or "an" element, that does not mean there is only one of the element. If the specification or claims refer to "an additional" element, that does not preclude there being more than one of the additional element.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the invention. Therefore, it is intended that this invention be limited only by the claims and the equivalents thereof.

What is claimed is:

1. An apparatus comprising:
a counter unit including a data port, a clock port and a plurality of counters, the data port to receive a serial data signal and the clock port to receive a clock signal, the serial data signal including a preamble and an embedded clock signal having an embedded clock signal frequency, the plurality of counters including a first counter operable to accumulate a first count that represents a length of a first sequence of data cells in the preamble, a second counter to accumulate a second count that represents a length of a second sequence of data cells in the preamble, a third counter to accumulate a third count that represents a length of a third sequence of data cells in the preamble, and a fourth counter that represents a length of a fourth sequence of data cells in the preamble;
a state machine coupled to the plurality of counters, the state machine to identify which one of the plurality of counters is to be incremented in order to accumulate a count between transitions in the preamble in response to the clock signal; and
a logic unit to determine the embedded clock signal frequency by determining that the first sequence of data cells, the second sequence of data cells, the third sequence of data cells, and the fourth sequence of data cells are indicative of the preamble, to determine a preamble count including a sum of count values of the accumulated first count, the accumulated second count, the accumulated third count, and the accumulated fourth count, and to determine the embedded clock signal frequency based on the preamble count.

2. The apparatus of claim 1, wherein the logic unit includes a jitter compensation storage unit to store a jitter compensation value.

3. The apparatus of claim 2, wherein the logic unit includes a division approximation correction unit to provide a correction term to the jitter compensation value.

4. The apparatus of claim 3, wherein the preamble includes one of a plurality of formats, the logic unit to process the jitter compensation value and the embedded clock signal frequency to identify the one of the plurality of formats included in the preamble.

5. The apparatus of claim 1, wherein the clock signal has a clock signal frequency and the logic unit includes a clock frequency ratio storage unit to store a ratio of the clock signal frequency to the embedded clock signal frequency.

6. The apparatus of claim 1, wherein the logic unit includes a synchronization correction unit to provide a correction term.

7. The apparatus of claim 1, wherein the transitions comprise zero-to-one and one-to-zero data transitions.

8. A method comprising:
receiving a serial data signal including a preamble and an embedded clock signal having an embedded clock signal frequency;
receiving a clock signal having a clock signal frequency;
incrementing, at the clock signal frequency, a single one of a plurality of counters during a given state, including incrementing a first counter to accumulate a first count that represents a length of a first sequence of data cells in the preamble during a first state, incrementing a second counter to accumulate a second count that represents a length of a second sequence of data cells in the preamble during a second state, incrementing a third counter to accumulate a third count that represents a length of a third sequence of data cells in the preamble during a third state, incrementing a fourth counter to accumulate a fourth count that represents a length of a fourth sequence of data cells in the preamble during a fourth state;
generating a preamble count including a sum of count values for each of the accumulated first count, the accumulated second count, the accumulated third count, and the accumulated fourth count; and
processing the preamble count using a logic unit to determine the embedded clock signal frequency.

9. The method of claim 8, wherein processing the preamble count using a logic unit to determine the embedded clock signal frequency comprises:
including one or more correction terms in the processing to determine the embedded clock signal frequency.

10. The method of claim 9, wherein including the one or more correction terms in the processing to determine the embedded clock signal frequency comprises:
including a jitter value in the processing to determine the embedded clock signal frequency.

11. The method of claim 9, wherein including the one or more error correction terms in the processing to determine the embedded clock signal frequency comprises:
including a synchronization correction term in the processing to determine the embedded clock signal frequency.

12. The method of claim 9, wherein including the one or more error terms in the processing to determine the embedded clock signal frequency comprises:
including a division approximation correction term in the processing to determine the embedded clock signal frequency.

13. The method of claim 8, wherein the preamble includes eight bits.

14. The method of claim 8, wherein the preamble has a length and processing the preamble count using a logic unit to determine the embedded clock signal frequency includes dividing the preamble count by eight.

15. An apparatus comprising:
an entertainment system;
a digital system included in the entertainment system, the digital system including a data port to receive a serial data signal and a clock port to receive a clock signal, the serial data signal including a preamble and an embedded clock signal, the clock signal having a clock signal frequency, the embedded clock signal having an embedded clock frequency, and the digital system to sample the preamble at a frequency related to the clock signal frequency and to form a ratio of the clock signal frequency to the embedded clock signal frequency;
the digital system including a plurality of counters including a first counter operable to accumulate a first count that represents a length of a first sequence of data cells in the preamble, a second counter to accumulate a second count that represents a length of a second sequence of data cells in the preamble, a third counter to accumulate a third count that represents a length of a third sequence of data cells in the preamble, and a fourth counter that represents a length of a fourth sequence of data cells in the preamble;
the digital system including a state machine coupled to the plurality of counters, the state machine to identify which one of the plurality of counters is to be incremented in order to accumulate a count between transitions in the preamble in response to the clock signal; and
the digital system including a logic unit to determine the embedded clock signal frequency by determining that the first sequence of data cells, the second sequence of data cells, the third sequence of data cells, and the fourth sequence of data cells are indicative of the preamble, to determine a preamble count including a sum of count values of the accumulated first count, the accumulated second count, the accumulated third count, and the accumulated fourth count, and to determine the embedded clock signal frequency based on the accumulated counts.

16. The apparatus of claim 15, wherein the digital system includes a jitter compensation storage unit to store a jitter compensation value.

17. The apparatus of claim 16, wherein the entertainment system includes a television.

18. The apparatus of claim 15, wherein the digital system includes a clock frequency ratio storage unit to store a ratio of the clock signal frequency to the embedded clock signal frequency.

19. The apparatus of claim 18, wherein the entertainment system includes a music system.

20. The apparatus of claim 15, wherein the digital system includes a synchronization correction unit.

21. The apparatus of claim 20, wherein the entertainment system includes a video projection system.

22. The apparatus of claim 15, wherein the digital system includes a division approximation correction unit.

23. The apparatus of claim 22, wherein the entertainment system includes a film projection system.

24. The apparatus of claim 1, wherein the serial data signal is a Sony/Philips Digital Interface format signal.

* * * * *

UNITED STATES PATENT AND TRADEMARK OFFICE
CERTIFICATE OF CORRECTION

PATENT NO. : 7,542,535 B2
APPLICATION NO. : 10/880969
DATED : June 2, 2009
INVENTOR(S) : Sreenath Kurupati It is certified that error appears in the above-identified patent and that said Letters Patent is hereby corrected as shown below:

In column 9, line 39, in Claim 9, before "logic" delete "a" and insert -- the --, therefor.

In column 9, line 62, in Claim 14, before "logic" delete "a" and insert -- the --, therefor.

Signed and Sealed this

Fifth Day of January, 2010

David J. Kappos
*Director of the United States Patent and Trademark Office*